(12) United States Patent
Saito (10) Patent No.: US 11,587,792 B2
(45) Date of Patent: Feb. 21, 2023

(54) METHOD FOR MANUFACTURING INGOT BLOCK, METHOD FOR MANUFACTURING SEMICONDUCTOR WAFER, AND DEVICE FOR MANUFACTURING INGOT BLOCK

(71) Applicant: SUMCO CORPORATION, Tokyo (JP)

(72) Inventor: Yasuhiro Saito, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 293 days.

(21) Appl. No.: 16/954,811

(22) PCT Filed: Oct. 22, 2018

(86) PCT No.: PCT/JP2018/039114
§ 371 (c)(1),
(2) Date: Jun. 17, 2020

(87) PCT Pub. No.: WO2019/123816
PCT Pub. Date: Jun. 27, 2019

(65) Prior Publication Data
US 2021/0098259 A1     Apr. 1, 2021

(30) Foreign Application Priority Data
Dec. 19, 2017  (JP) ............................. JP2017-242865

(51) Int. Cl.
*H01L 21/30*     (2006.01)
*H01L 21/304*    (2006.01)
(Continued)

(52) U.S. Cl.
CPC .......... *H01L 21/304* (2013.01); *B28D 5/0052* (2013.01); *B28D 5/0064* (2013.01);
(Continued)

(58) Field of Classification Search
CPC ...... B28D 5/0052; B28D 5/0064; B28D 5/04; B28D 5/045; C30B 15/00; C30B 15/206; C30B 29/06; C30B 33/00; H01L 21/304
See application file for complete search history.

(56) References Cited

U.S. PATENT DOCUMENTS 5,007,204 A * 4/1991  Ibe .................... G01B 13/08
                                                    451/49
5,620,357 A    4/1997  Misaka et al.
(Continued)

FOREIGN PATENT DOCUMENTS

CN    1498426 A       5/2004
CN    104070613      10/2014
(Continued)

OTHER PUBLICATIONS

IPRP for PCT/JP2018/039114, dated Jun. 23, 2020.
(Continued)

*Primary Examiner* — Matthew J Song
(74) *Attorney, Agent, or Firm* — Greenblum & Bernstein, P.L.C.

(57) ABSTRACT

A method for manufacturing an ingot block in which an ingot of a silicon single crystal pulled up by a Czochralski process is cut and subjected to outer periphery grinding to manufacture an ingot block of the silicon single crystal, the method including: a step of measuring a radial center position of the ingot at one or more locations along a longitudinal direction of the ingot, a step of setting a reference position at which an offset amount of the measured radial center position of the ingot is equal to or less than a predetermined eccentricity amount, a step of cutting the ingot into the ingot blocks based on the set reference position, and a step of performing outer periphery grinding on each of the cut ingot blocks.

5 Claims, 9 Drawing Sheets

(51) Int. Cl.
  *B28D 5/04* (2006.01)
  *B28D 5/00* (2006.01)
  *C30B 33/00* (2006.01)
  *C30B 29/06* (2006.01)
  *C30B 15/20* (2006.01)
  *C30B 15/00* (2006.01)

(52) U.S. Cl.
  CPC .............. *B28D 5/04* (2013.01); *B28D 5/045* (2013.01); *C30B 15/00* (2013.01); *C30B 15/206* (2013.01); *C30B 29/06* (2013.01); *C30B 33/00* (2013.01)

(56) References Cited

U.S. PATENT DOCUMENTS

| | | | |
|---|---|---|---|
| 2007/0243695 A1 | 10/2007 | Iida | |
| 2010/0006081 A1* | 1/2010 | Choi | B28D 5/00 451/41 |

FOREIGN PATENT DOCUMENTS

| | | |
|---|---|---|
| CN | 104170063 A | 11/2014 |
| CN | 107116710 A | 9/2017 |
| JP | 6-109439 | 4/1994 |
| JP | 6-166600 | 6/1994 |
| JP | 7-285069 | 10/1995 |
| JP | 2554408 | 8/1996 |
| JP | 2002-164311 | 6/2002 |
| JP | 2003-332183 | 11/2003 |
| JP | 2004-58185 | 2/2004 |
| JP | 2011-5604 | 1/2011 |
| JP | 2017-212268 | 11/2017 |
| TW | 201634764 | 10/2016 |
| WO | 2005/076333 | 8/2005 |
| WO | WO 2014/162657 A1 | 10/2014 |
| WO | 2016/038980 | 3/2016 |

OTHER PUBLICATIONS

Office Action for CN App. No. 201880082329.3, dated Jun. 30, 2021 (w/ translation).

Official Communication issued in International Bureau of WIPO Patent Application No. PCT/JP2018/039114, dated Dec. 11, 2018.

Office Action issued in Taiwan Counterpart Patent Appl. No. 107130950, dated Mar. 29, 2019, along with an English translation thereof.

* cited by examiner

METHOD FOR MANUFACTURING INGOT BLOCK, METHOD FOR MANUFACTURING SEMICONDUCTOR WAFER, AND DEVICE FOR MANUFACTURING INGOT BLOCK

TECHNICAL FIELD

The present invention relates to a method for manufacturing an ingot block, a method for manufacturing a semiconductor wafer, and a device for manufacturing an ingot block.

BACKGROUND ART

In the related art, an ingot of a silicon single crystal pulled up by the Czochralski process has been subjected to outer periphery grinding in a state of the ingot after being pulled up. After the outer periphery grinding, the ingot is cut into ingot blocks of a predetermined length, an azimuth reference position is determined for each ingot block by X-ray diffraction, and an orientation flat or a notch is formed according to the azimuth reference position (for example, see Patent Literature 1).

By the way, in a device process of a semiconductor wafer, a defect due to a slip dislocation generated in a high-temperature heat treatment process may cause a problem. The defect depends on the strength of the semiconductor wafer.

Generally, a region with a high oxygen concentration in the semiconductor wafer has high strength, and a region with a low oxygen concentration has low strength. Therefore, in a case where a low oxygen concentration region exists in the semiconductor wafer, the risk of occurrence of defects due to slip dislocation increases.

On the other hand, the low oxygen melt on the liquid level surface layer of the melt in a crucible in growing the silicon single crystal is likely to be taken into an outer periphery of the ingot of the silicon single crystal manufactured by the Czochralski process. Therefore, the interstitial oxygen concentration of the ingot of the silicon single crystal tends to decrease toward the outer periphery portion. Accordingly, how to remove and reduce the low oxygen concentration region in the outer periphery grinding step is a problem for reducing defects due to slip dislocation in the device process.

CITATION LIST

Patent Literature

[Patent Literature 1] Japanese Patent Application No. H06-166600 A

SUMMARY OF THE INVENTION

Problems to be Solved by the Invention

In the technology disclosed in Patent Literature 1, since the outer periphery grinding is performed in the state of the ingot, eccentricity, so-called bend, may occur in the ingot at a radial center position of the ingot. In a case where such an ingot is cut into ingot blocks at a desired position and subjected to outer periphery grinding, eccentricity occurs in the low oxygen concentration region due to the eccentricity at the radial center position, and thus the low oxygen concentration region of the ingot block increases.

In a case where the semiconductor wafer is manufactured by slicing the ingot block in which the low oxygen concentration region increases, the low oxygen concentration region in the outer peripheral portion of the semiconductor wafer increases, and the risk of defects due to slip dislocation in the device process increases.

An object of the invention is to provide a method for manufacturing an ingot block capable of manufacturing a semiconductor wafer with the reduced risk of occurrence of defects due to slip dislocation in a device process, a method for manufacturing a semiconductor wafer, and a device for manufacturing an ingot block.

Means for Solving the Problems

According to an aspect of the invention, there is provided a method for manufacturing an ingot block in which an ingot of a silicon single crystal pulled up by a Czochralski process is cut and subjected to outer periphery grinding to manufacture an ingot block of the silicon single crystal, the method including: a step of measuring a radial center position of the ingot at one or more locations along a longitudinal direction of the ingot; a step of setting a reference position at which an offset amount of the measured radial center position of the ingot is equal to or less than a predetermined eccentricity amount; a step of cutting the ingot into the ingot blocks based on the set reference position; and a step of performing outer periphery grinding on each of the cut ingot blocks.

According to the above aspect of the invention, since the radial center position of the ingot is measured at a plurality of locations along the longitudinal direction of the ingot, it is possible to grasp the offset amount of the radial center position of the ingot according to the position of the ingot in the longitudinal direction. Accordingly, the ingot is cut into the ingot blocks at the radial center position where the offset amount of the radial center position is equal to or less than a predetermined eccentricity amount with respect to the reference position, and thus, it is possible to make the offset amount at the radial center position in the ingot block to be equal to or less than a predetermined eccentricity amount.

It is possible to reduce the low oxygen concentration region in the outer peripheral portion of the ingot block by outer periphery grinding the ingot block in which the offset amount in the radial position is equal to or less than a predetermined eccentricity amount. Accordingly, it is possible to reduce the risk of occurrence of defects due to slip dislocation in the device process by slicing such an ingot block to manufacture the semiconductor wafer.

According to the above aspect of the invention, it is preferable that in the step of measuring the radial center position, the radial center position is measured while the ingot is rotated in a circumferential direction.

According to the above aspect of the invention, it is possible to grasp which direction the radial center position is eccentric by rotating and measuring the ingot. Accordingly, since the eccentric direction of the ingot can be grasped, it is possible to measure the radial center position of the ingot with higher accuracy.

According to the above aspect of the invention, it is preferable that in a case where a diameter of the pulled-up ingot is D1 (mm) and a diameter of a semiconductor wafer manufactured from the ingot is D2 (mm), the predetermined eccentricity amount $\Delta$ (mm) is obtained by Equation (1).

$$(D1-D2)/2-\Delta \geq 3 \text{(mm)} \quad (1)$$

The low oxygen concentration region generated at the outer peripheral end portion of the ingot is formed at a predetermined radial depth from the outer peripheral end portion of the ingot. Accordingly, a predetermined eccentricity amount Δ satisfies Equation (1), thereby the low oxygen concentration region can be reliably removed.

According to another aspect of the invention, there is provided a method for manufacturing a semiconductor wafer, the method including a step of manufacturing an ingot block of a silicon single crystal by using the method for manufacturing an ingot block according to any one of descriptions, and a step of slicing the manufactured ingot block to manufacture a plurality of wafers.

According to the above aspect of the invention, the same operations and effects as those described above can be obtained.

According to still another aspect of the invention, there is provided a device for manufacturing an ingot block which cuts an ingot of a silicon single crystal pulled up by a Czochralski process to manufacture an ingot block of the silicon single crystal, the device including: a placing table on which the ingot is placed; a measuring device that is provided to be movable along a longitudinal direction of the ingot on the placing table; a cutting device that is provided to be movable along the longitudinal direction of the ingot on the placing table; and a control device that performs movement control of the measuring device and the cutting device, in which the measuring device includes an outer peripheral end surface position detection unit that irradiates an end portion of an outer peripheral surface of the ingot with laser light and detect the irradiated laser light to detect an end portion position of the outer peripheral surface of the ingot, and a center position calculating unit that calculates a radial center position of the ingot based on the end portion position of the outer peripheral surface of the ingot detected by the outer peripheral end surface position detection unit, and the control device includes a measurement position movement control unit that moves the measuring device and measures the radial center position of the ingot at one or more locations in the longitudinal direction of the ingot, a reference position setting unit that sets a reference position serving as a reference of the cutting position of the ingot based on the radial center position calculated by the center position calculating unit at each location in the longitudinal direction of the ingot, and a cutting position movement control unit that moves the cutting device to the reference position set by the reference position setting unit and performs cutting of the ingot.

According to the above aspect of the invention, since the method for manufacturing an ingot block described above can be automatically performed by a device, the efficiency of manufacturing the ingot block and the labor-saving can be achieved.

DESCRIPTION OF THE EMBODIMENTS

Hereinafter, embodiments of the invention will be described with reference to the drawings.

[1] Structure of Silicon Single Crystal Pulling-Up Device 1

Figure 1:
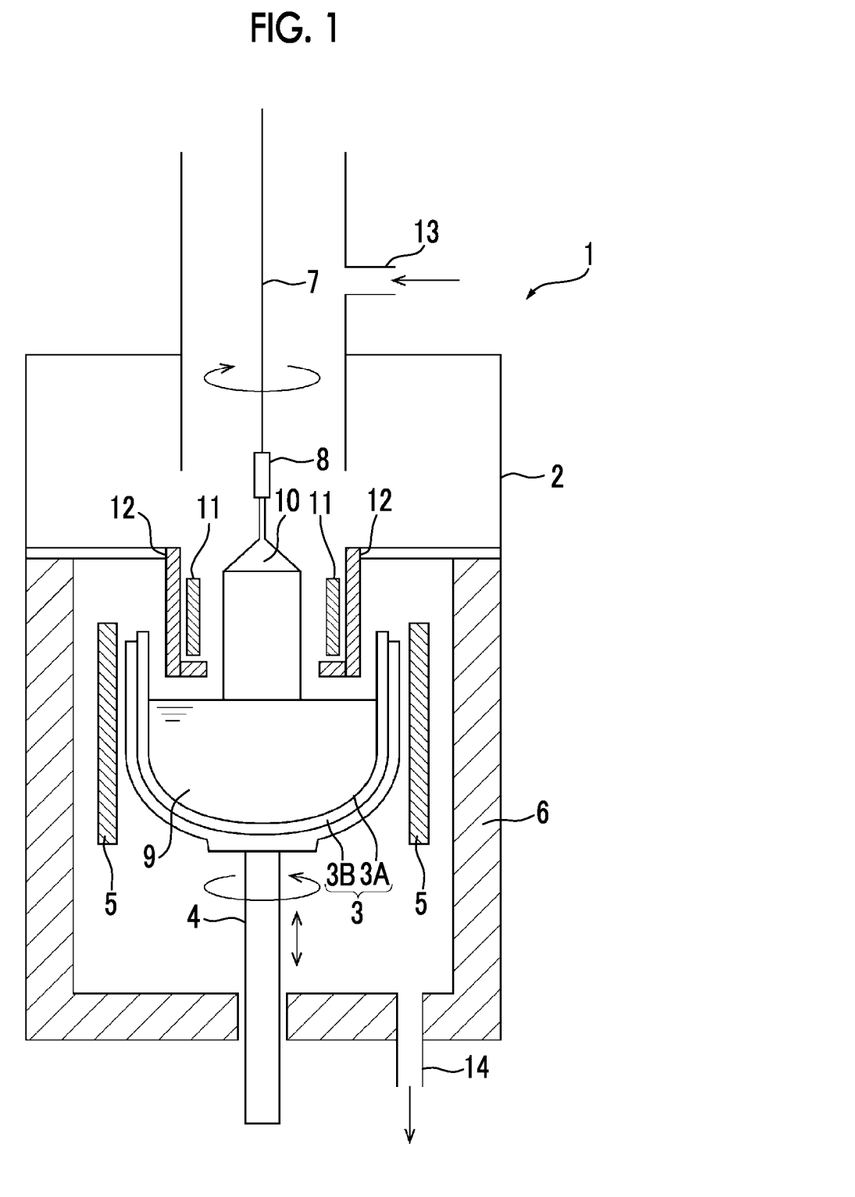
FIG. 1 is a schematic diagram showing a structure of a silicon single crystal pulling-up device according to a first embodiment of the invention.

FIG. 1 is a schematic diagram showing an example of a structure of a silicon single crystal pulling-up device 1 to which a method for manufacturing a silicon single crystal 10 according to a first embodiment of the invention can be applied. The pulling-up device 1 is a device that pulls up the silicon single crystal 10 by the Czochralski process, and includes a chamber 2 forming an outer shell and a crucible 3 disposed in a center portion of the chamber 2.

The crucible 3 has a double structure composed of an inner quartz crucible 3A and an outer graphite crucible 3B, and is fixed to an upper end portion of a support shaft 4 which is rotatable and liftable.

A resistance heating type heater 5 surrounding the crucible 3 is provided outside the crucible 3, and a heat insulating material 6 is provided along an inner surface of the chamber 2 outside the heater 5.

A pulling shaft 7 such as a wire which rotates at a predetermined speed in the opposite direction or the same direction coaxially with the support shaft 4 is provided above the crucible 3. A seed crystal 8 is attached to a lower end of the pulling shaft 7.

A cylindrical water cooler 11 surrounding the silicon single crystal 10 being grown above a silicon melt 9 in the crucible 3 is arranged in the chamber 2.

The water cooler 11 is made of, for example, a metal having good thermal conductivity such as copper, and forcibly cools the silicon single crystal 10 by coolant circulated therein. The water cooler 11 acts to promote cooling of the silicon single crystal 10 being grown and acts to control a temperature gradient of the center portion and the outer peripheral portion of the single crystal in the direction of the pulling shaft 7.

A cylindrical heat shielding body 12 is disposed so as to surround the outer peripheral surface and the lower end surface of the water cooler 11.

The heat shielding body 12 acts to shield the silicon single crystal 10 being grown from high-temperature radiant heat from the silicon melt 9 in the crucible 3, the heater 5, or a side wall of the crucible 3, and with respect to the vicinity of a solid-liquid interface which is a crystal growth interface, acts to suppress the diffusion of heat to the outside and control the temperature gradients of a central portion and the outer peripheral portion of the single crystal in a pulling shaft direction.

Further, the heat shielding body 12 also has a function as a rectifying cylinder that exhausts the evaporated matter from the silicon melt 9 to the outside of the furnace by using an inert gas introduced from above the furnace.

A gas inlet port 13 for introducing an inert gas such as an argon gas (hereinafter, referred to as an Ar gas) into the chamber 2 is provided in an upper portion of the chamber 2. An exhaust port 14 for sucking and discharging the gas in the chamber 2 by driving a vacuum pump (not shown) is provided in a lower portion of the chamber 2.

The inert gas introduced into the chamber 2 from the gas inlet port 13 moves down between the silicon single crystal 10 being grown and the heat shielding body 12, and flows to the outside of the heat shielding body 12 and toward the outside of the crucible 3 after flowing through a gap between a lower end of the heat shielding body 12 and a liquid level of the silicon melt 9. Then, the inert gas moves down along the outside of the crucible 3, and is discharged from the exhaust port 14.

In manufacturing the silicon single crystal 10 using such a pulling-up device 1, a solid raw material such as a polycrystalline silicon filled in the crucible 3 is melted by heating of the heater 5 while the inside of the chamber 2 is maintained in an inert gas atmosphere under reduced pressure to form the silicon melt 9.

In a case where the silicon melt 9 is formed in the crucible 3, the pulling shaft 7 is moved down to immerse the seed crystal 8 in the silicon melt 9, and while the crucible 3 and the pulling shaft 7 are rotated in a predetermined direction, the pulling shaft 7 is gradually pulled up, and as a result, the silicon single crystal 10 continuous to the seed crystal 8 is grown.

[2] Cause of Low Oxygen Concentration Region in Semiconductor Wafer

In a case where the silicon single crystal 10 is pulled up by the silicon single crystal pulling-up device 1 described above, the low oxygen melt of the liquid level surface layer of the silicon melt 9 is likely to be taken into the outer peripheral portion of the ingot of the pulled-up silicon single crystal 10.

Figure 2:
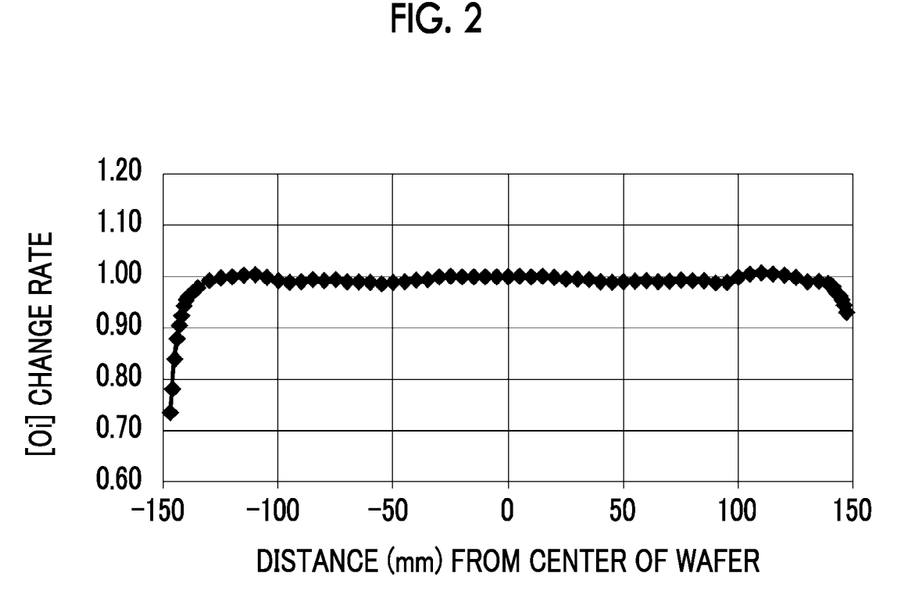
FIG. 2 is a graph showing a change in interstitial oxygen concentration from a center of a wafer to an end portion of a semiconductor wafer according to the first embodiment.

Therefore, the interstitial oxygen concentration [Oi] tends to decrease in the outer peripheral portion of the semiconductor wafer, and as shown in FIG. 2, in a case of the semiconductor wafer having a diameter of 300 mm, the interstitial oxygen concentration [Oi] greatly decreases in the outer peripheral portion more than 147 mm from the center of the wafer.

As described above, the interstitial oxygen concentration [Oi] of the ingot of the pulled-up silicon single crystal 10 generally decreases toward the outside in the radial direction, and a region having the lowest interstitial oxygen concentration [Oi] exists on the ingot surface.

Therefore, by performing the outer periphery grinding on the silicon single crystal 10, the region where the interstitial oxygen concentration [Oi] decreases can be removed, and thus the semiconductor wafer as a final product without a region having the low interstitial oxygen concentration [Oi] can be obtained.

Figure 3A:
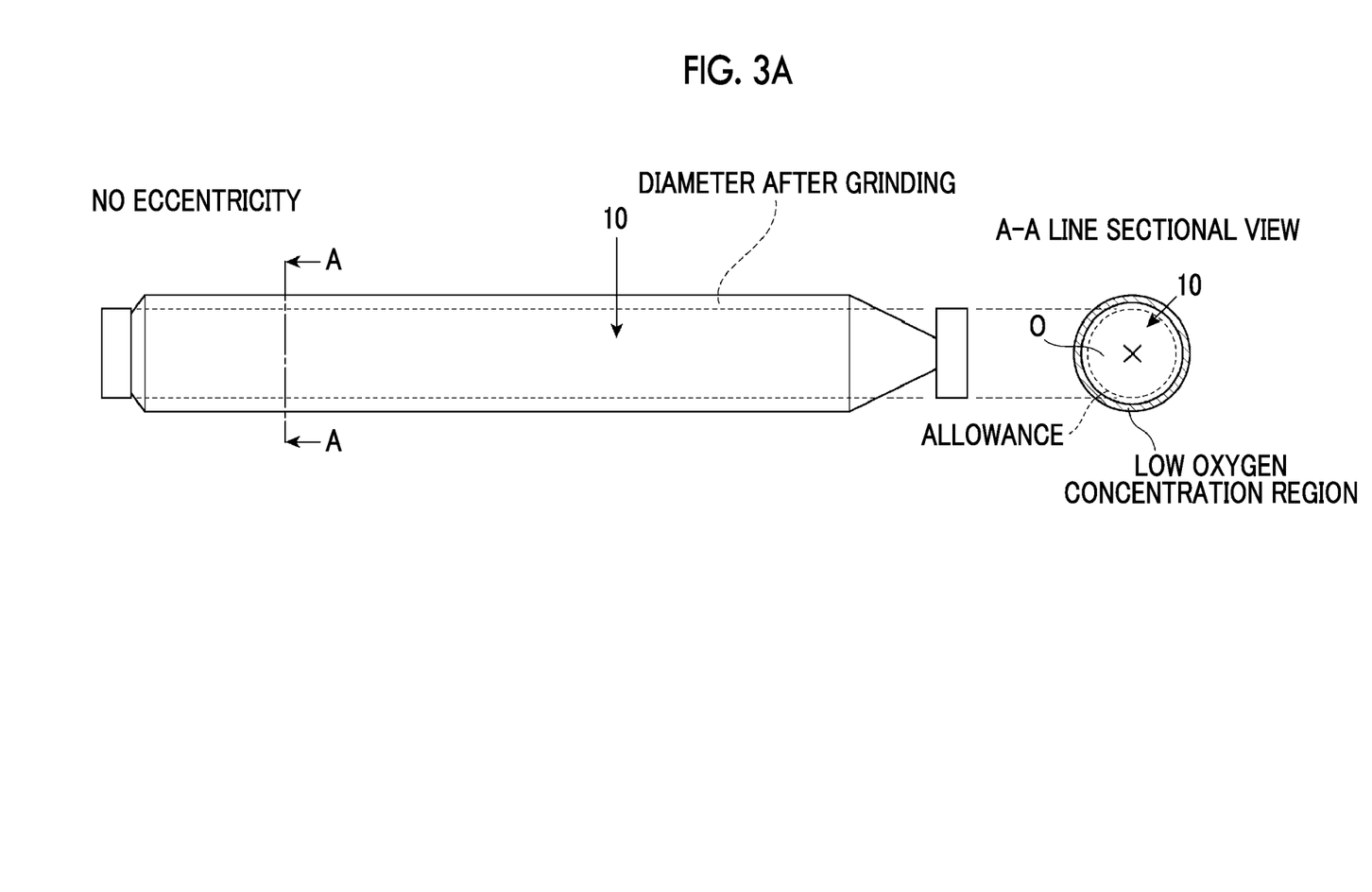
FIG. 3A is a schematic diagram for explaining a difference due to a presence or absence of eccentricity of an ingot of the silicon single crystal according to the first embodiment.

Here, in a case where the silicon single crystal 10 is not eccentric or pulled up with an eccentricity within an allowable range, the ingot of the silicon single crystal 10 has the low oxygen concentration region which is formed in a uniform thickness in the outer peripheral portion of a high oxygen concentration region of the interstitial oxygen concentration [Oi] around a crystal center O as shown in the sectional view taken along the line A-A of FIG. 3A.

In this case, in a case where outer periphery grinding is performed with a fixed allowance in a state of the ingot of the silicon single crystal 10, it is possible to completely remove the low oxygen concentration region after grinding, for example, a portion having the [Oi] change rate of 0.7 to 0.8 in FIG. 2.

Figure 3B:
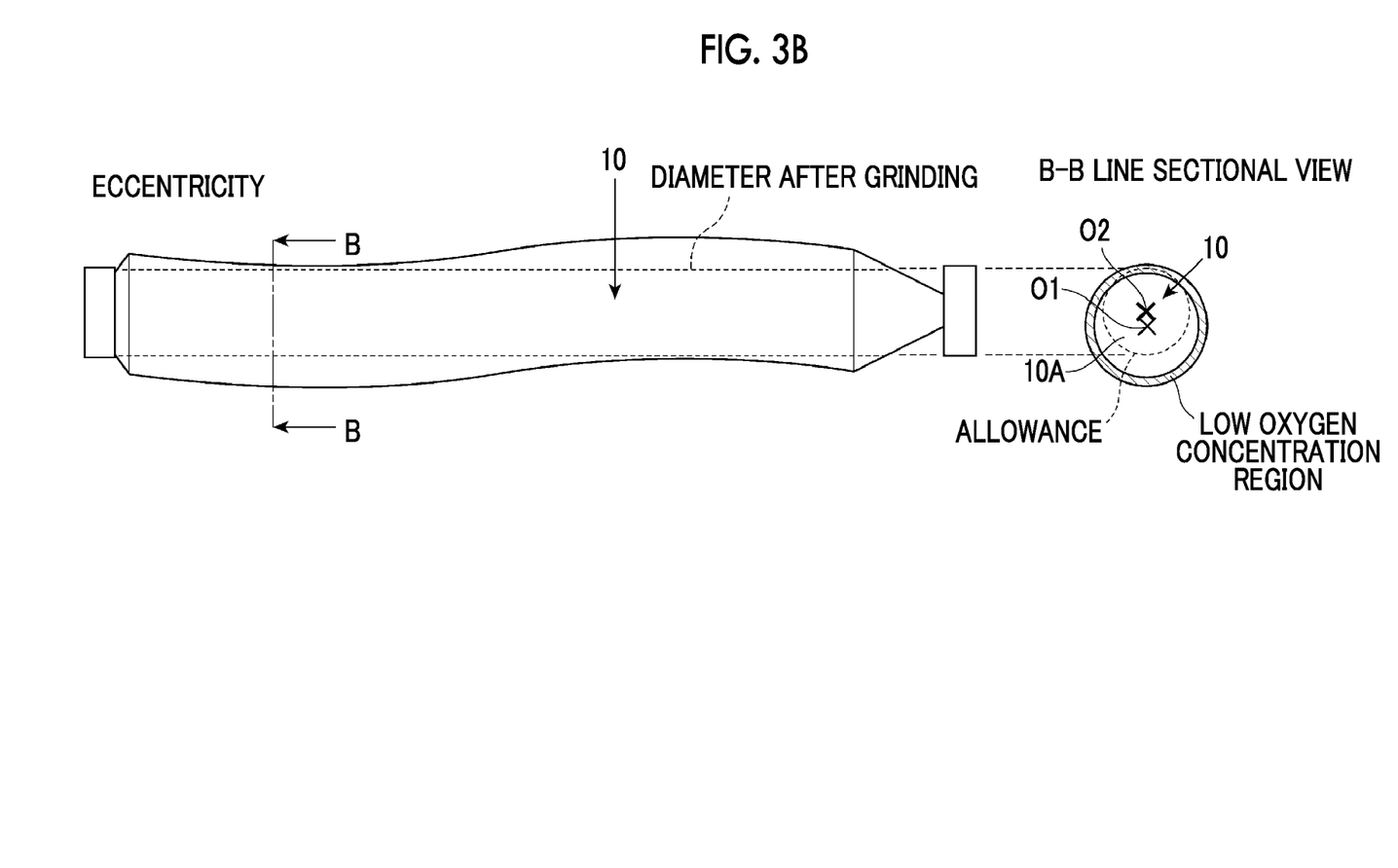
FIG. 3B is a schematic diagram for explaining a difference due to the presence or absence of eccentricity of the ingot of the silicon single crystal according to the first embodiment.

On the other hand, in the actual pulling-up of the silicon single crystal 10, as shown in FIG. 3B, bend in the ingot of the silicon single crystal 10 may occur and the eccentricity of the crystal center in the radial direction of the silicon single crystal 10 may occur.

The bend in the ingot of the silicon single crystal 10 occurs because an actual value of pulling up differs from a target value of pulling up, and is mainly caused by the pulling-up speed and the crystal rotation speed.

In a case where the bend occurs in the ingot of the silicon single crystal 10, a crystal center O2 during the pulling up is eccentric in the radial direction from a crystal center O1 at the pulling-up start position, which is the reference position, as shown in the sectional view taken along the line B-B in FIG. 3B. Then, the low oxygen concentration region generated with a constant thickness dimension around the crystal center O2 is also eccentric.

In a case where the outer periphery grinding is performed on the ingot of the silicon single crystal 10 in the above-described state, the outer periphery grinding is performed on the ingot of the silicon single crystal 10 with a fixed allowance. Therefore, in a case where the outer periphery grinding is performed on the ingot of the silicon single crystal 10, a portion having a large allowance and a portion having a small allowance are generated as shown in the lower portion of the sectional view taken along the line B-B. In a portion having a small allowance, the allowance is small, so that the low oxygen concentration region remains as in a region 10A in FIG. 3B.

In a case where the semiconductor wafer is manufactured by slicing such an ingot of the silicon single crystal 10, the semiconductor wafer is manufactured in which a low oxygen concentration region with a very low oxygen concentration remains on the outer peripheral portion of the wafer. Due to the remaining of the low oxygen concentration region, the risk of defects due to slip dislocation in the device process increases.

Therefore, in the present embodiment, the radial center position of the ingot, that is, the crystal center is measured at a plurality of locations along the pulling-up direction of the ingot of the silicon single crystal 10, and the position for cutting the ingot into the ingot blocks is determined based on the measurement result.

[3] Structure of Eccentricity Measuring Device 20

Figure 4:
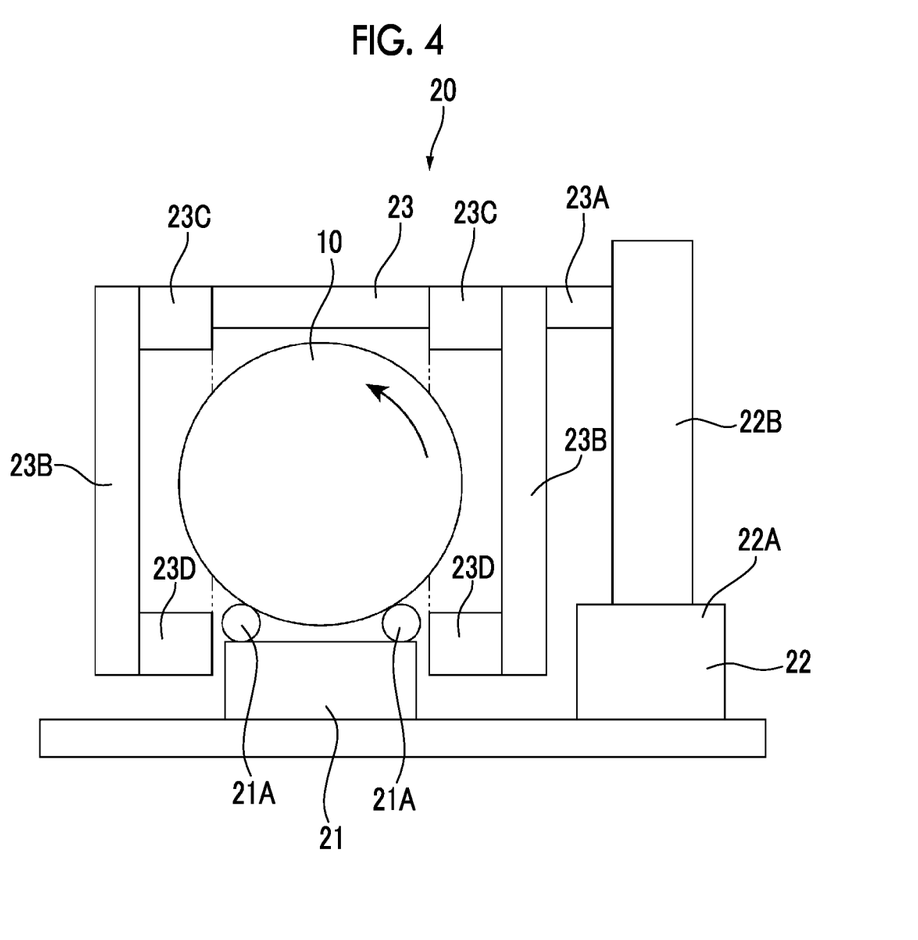
FIG. 4 is a schematic diagram showing a structure of an eccentricity measuring device that measures an eccentricity amount of a radial center of the ingot of the silicon single crystal according to the first embodiment.

The radial center position of the ingot of the silicon single crystal 10 can be measured by using an eccentricity measuring device 20 shown in FIG. 4. The eccentricity measuring device 20 includes a placing table 21, a moving mechanism 22, and a measuring unit 23.

The placing table 21 is a table on which the ingot of the silicon single crystal 10 is placed. The placing table 21 has a width dimension slightly smaller than a radial dimension of the silicon single crystal 10 and a longitudinal dimension substantially same as a length dimension of a straight body portion of the ingot of the silicon single crystal 10. A plurality of fixed rollers 21A are provided on an upper surface of the placing table 21 along the longitudinal direction of the placing table 21.

The moving mechanism 22 is configured to be able to move the measuring unit 23 along the longitudinal direction of the silicon single crystal 10, and includes a moving mechanism main body 22A and a measuring unit attachment unit 22B.

The moving mechanism main body 22A is provided to be movable along the longitudinal direction of the ingot of the silicon single crystal 10 on a surface plate on which the placing table 21 is set. The moving mechanism main body 22A is configured as a robot having a built-in arithmetic function, and performs movement control triggered by completion of measurement of the radial center position of the ingot by the measuring unit 23.

The measuring unit attachment unit 22B is configured as a columnar member that protrudes vertically from an upper surface of the moving mechanism main body 22A. A measuring unit 23 is provided in an upper portion of the measuring unit attachment unit 22B.

The measuring unit 23 measures the radial center position of the ingot of the silicon single crystal 10. The measuring unit 23 includes a holding arm 23A, a hanging unit 23B, a laser light irradiation unit 23C, and laser light receiving unit 23D.

The holding arm 23A is provided in an upper portion of the measuring unit attachment unit 22B, and extends in the horizontal direction.

Two hanging units 23B are provided so as to hang down from the holding arm 23A, and are arranged at radial end portions of the silicon single crystal 10. Each hanging unit 23B may be slidably attached to holding arm 23A according to the diameter of silicon single crystal 10.

The laser light irradiation unit 23C is provided at a base end of each hanging unit 23B in the extending direction. The laser light irradiation unit 23C irradiates the ingot of the silicon single crystal 10 with laser light with a predetermined width at the radial end portion of the ingot.

The laser light receiving unit 23D is provided at a lower end of each hanging unit 23B in the extending direction. The laser light receiving unit 23D detects the irradiated laser light from the laser light irradiation unit 23C, and detects the end portion position of the ingot of the silicon single crystal 10 based on the irradiated laser light. Specifically, the laser light receiving unit 23D has a light receiving window corresponding to a laser light irradiation window of the laser light irradiation unit 23C, and detects the width direction position of the laser light shielded by the ingot of the silicon single crystal 10.

Stated another way, the laser light irradiation unit 23C and the laser light receiving unit 23D are symmetrically arranged at both end portions of the ingot of the silicon single crystal 10, and function as an outer peripheral end surface position detection unit that detects the outer peripheral end portion position of the ingot. In the present embodiment, the laser light irradiation unit 23C and the laser light receiving unit 23D are provided at both end portions of the ingot, but the invention is not limited to thereto. For example, the laser light irradiation unit 23C and the laser light receiving unit 23D are provided only at one end portion of the ingot of the silicon single crystal 10, the ingot of the silicon single crystal 10 is rotated, thereby the end portion of the ingot of the silicon single crystal 10 may be detected.

The shielding amounts of the laser light by the ingot at both end portions of the ingot are obtained by such a measuring unit 23. It is possible to determine how much the end portion position of the silicon single crystal 10 is offset in the width direction based on the shielding amounts of the laser light in the width direction as compared with a case where both end portions are uniform. The obtained offset amount can be obtained as the radial center position of the ingot of the silicon single crystal 10. Such calculation of the radial center position of the ingot can be performed by a controller provided separately outside, but in the present embodiment, the calculation is performed by an arithmetic processing device in the moving mechanism main body 22A. Stated another way, the arithmetic processing device functions as the center position calculating unit of the embodiment of the invention.

As shown in FIG. 4, the placing table 21 can rotate the ingot of the silicon single crystal 10 in the circumferential direction by the fixed roller 21A. By rotating the ingot, the offset amount can be measured at the same location a plurality of times, and thus it is possible to grasp which direction the radial center position of the ingot faces.

In this case, in a case where an offset amount in one direction is d1 and an offset amount in the other direction is d2, the offset amount as a representative value can be calculated by $d=\sqrt{(d1^2+d2^2)}$.

Figure 5:
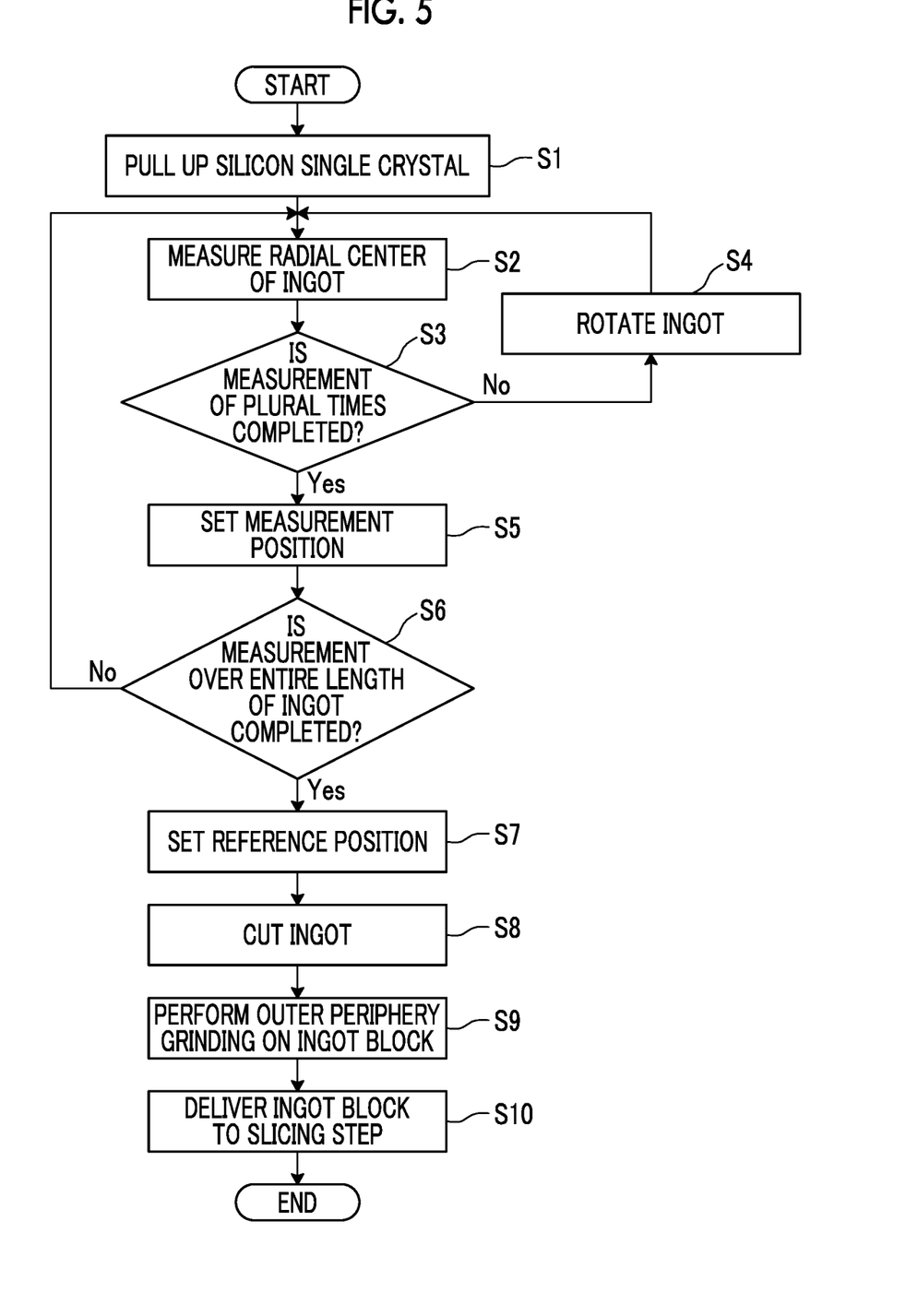
FIG. 5 is a flowchart showing a method for manufacturing an ingot block of the silicon single crystal according to the first embodiment.

[4] Method for Manufacturing Ingot Block of Silicon Single Crystal 10 in Present Embodiment The method for manufacturing the ingot block of the silicon single crystal 10 is performed based on the flowchart shown in FIG. 5.

The silicon single crystal 10 is pulled up using the pulling-up device 1 described above (Step S1).

The radial center of the pulled-up ingot of the silicon single crystal 10 is measured (Step S2). Specifically, the measurement is performed at a plurality of locations along the pulling-up direction, with the longitudinal end of the straight body portion on a top side or a tail side of the silicon single crystal 10 as an initial reference position. For example, in a case where the end of the straight body portion on the top side is set as the reference position, the radial center position is measured at a plurality of locations from the top side to the tail side.

It is determined whether the measurement is performed a plurality of times at one location (Step S3).

In a case where measurement of plural times is not completed, the ingot of the silicon single crystal 10 is rotated about the pulling shaft (Step S4: see FIG. 4), and the process returns to Step S2 to perform the measurement a plurality of times.

When the measurement of plural times is completed, the measuring unit 23 is moved in the longitudinal direction of the silicon single crystal 10 by the moving mechanism 22, and a new measurement position is set (Step S5).

After the measuring unit 23 is moved, the process is performed from Step S2 at a new measurement position, and the measurement is repeated until the radial center position is completely measured over the entire length of the ingot of the silicon single crystal 10 in the longitudinal direction (Step S6).

When the radial center position of the silicon single crystal 10 is completely measured, the position where the measurement results are less than a predetermined eccentricity amount is set as the reference position serving as the reference of the cutting position of the ingot of the silicon single crystal 10 (Step S7).

The reference position refers to the end surface of the ingot block in which the difference between the maximum value of the offset amount at the measured radial center position of the silicon single crystal 10 and the offset amounts at both end portions of the block is larger. Specifically, in a case where the maximum value of the measured value of the eccentricity amount of the ingot block is MAX (mm), the measured value of the offset amount of the end surface of the ingot block on the top side is X1 (mm), and the measured value of the offset amount of the end surface of the ingot block on the tail side is X2 (mm), the reference position is set as a larger end surface of |MAX-X1| (mm) and |MAX-X2| (mm).

In a case where a diameter of the ingot is D1 (mm) of the silicon single crystal 10 and a diameter of a semiconductor wafer manufactured from the ingot is D2 (mm), the predetermined eccentricity amount Δ is set by Equation (2).

$$(D1-D2)/2-\Delta \geq 3 \text{(mm)} \quad (2)$$

For example, in a case where D1=312 mm and D2=300 mm, 3 (mm)≥Δ is satisfied, and thus the predetermined eccentricity amount Δ at the radial center position of the silicon single crystal 10 is 3 mm.

The reference position is set based on the predetermined eccentricity amount Δ and is set to be equal to or less than the predetermined eccentricity amount Δ. For example, in a case where the predetermined eccentricity amount Δ is 3 mm, a range where the offset amount of the radial center position is equal to or less than 3 mm can be set as the reference position.

After the reference position is set, the ingot of the silicon single crystal 10 is cut using the reference position as the cutting position to manufacture a plurality of ingot blocks (Step S8). The cutting of the ingot block is performed using a general-purpose cutting device such as a band saw. In the present embodiment, the cutting position is determined solely from the viewpoint of the bend. However, in actual manufacture, the cutting position can be set from the viewpoint other than the bend within a range where the offset amount of the measured radial center position of the ingot is equal to or less than a predetermined eccentricity amount, that is, within a range where the conditions determined from the viewpoint of the bend is satisfied.

For example, the cutting position can be set so that an outer periphery grinding machine that grinds the outer periphery of the block or a slicing machine that slices the block into a wafer does not exceed the block length that can be processed. As an example, in a case where the offset amount of the radial center position of the silicon single crystal 10 is about zero, and the offset amount of the radial center position of the ingot is equal to or less than a predetermined eccentricity amount in the entire region in the longitudinal direction of the silicon single crystal, the ingot may be cut so as to have a maximum block length that can be processed by an outer periphery grinding machine or a slicing machine.

In addition, the cutting position can be set based on other pulling-up control data such as the result of the pulling-up speed and the quality evaluation result of the sample wafer cut from the end portion of the ingot block. Finally, the outer periphery grinding is performed on the cut ingot block (Step S9). The outer periphery grinding of the ingot block is performed using a general-purpose outer periphery grinding machine.

When the cutting of all the ingot blocks and the outer periphery grinding are completed, the ingot blocks are delivered to a slicing step (Step S10), and in the slicing step, the semiconductor wafer is sliced with a wire saw or the like to manufacture a semiconductor wafer.

[5] Advantage(s) of Embodiment

According to the present embodiment, the following Advantages can be obtained.

Figure 6A:
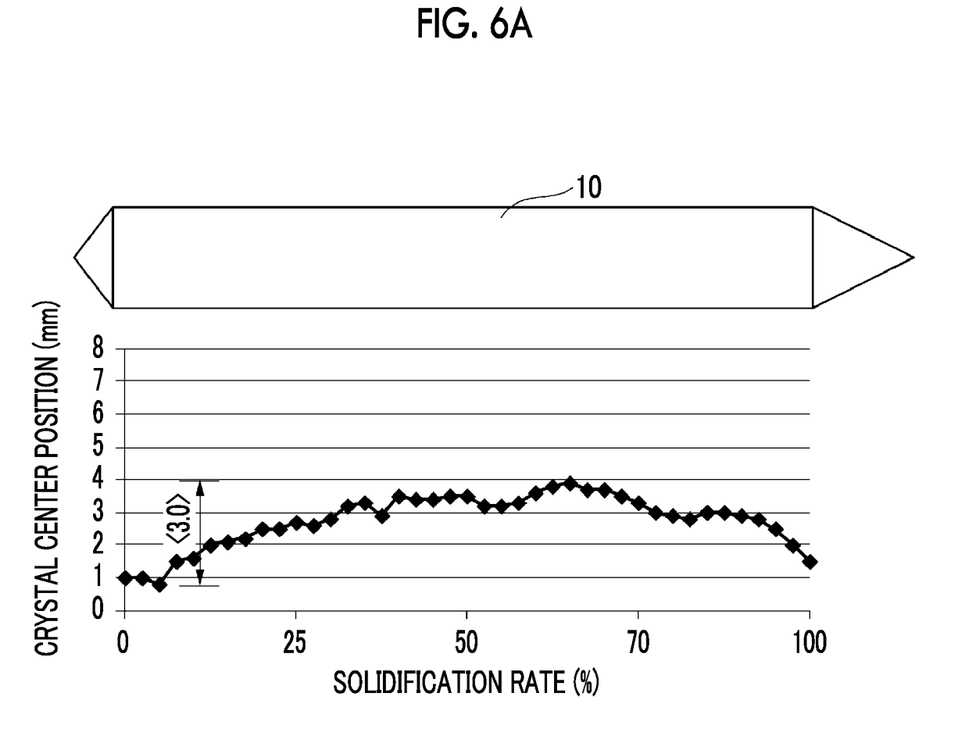
FIG. 6A is a schematic diagram for explaining effects according to the first embodiment.

That is, as shown in FIG. 6A, in the ingot of the pulled-up silicon single crystal 10, the radial center position has an offset amount exceeding 3 mm over the entire length. In a case where the outer periphery grinding is performed as it is, the low oxygen concentration region generated on the outer peripheral surface of the silicon single crystal 10 cannot be removed by the allowance for the outer periphery grinding, so that defects due to slip dislocation in the device process cannot be reduced.

Figure 6B:
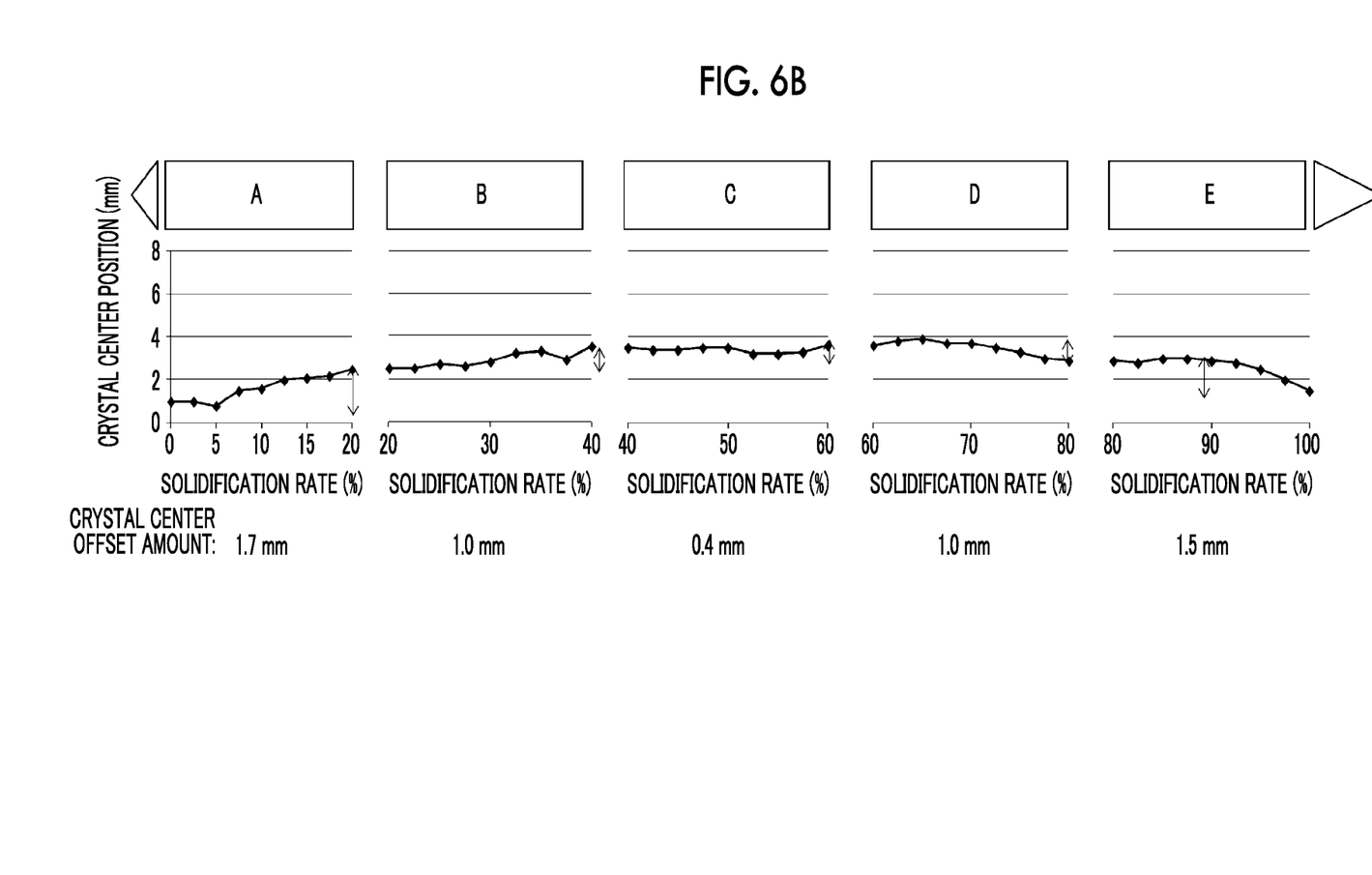
FIG. 6B is a schematic diagram for explaining effects according to the first embodiment.

On the other hand, in a case where the ingot block is cut out by the method for manufacturing the ingot block according to the present embodiment, as shown in FIG. 6B, it can be suppressed such that the offset amount of the ingot block A is 1.7 mm, the offset amount of the ingot block B is 1.0 mm, the offset amount of the ingot block C is 0.4 mm, the offset amount of the ingot block D is 1.0 mm, the offset amount of the ingot block E is 1.5 mm.

Therefore, by performing outer periphery grinding on each of the ingot blocks A to E, it is possible to reliably remove the low oxygen concentration region generated on the surface of the ingot, and to reduce defects due to slip dislocation of the manufactured semiconductor wafer.

[6] Second Embodiment

Next, a second embodiment of the invention will be described. In the following description, the description of the same portions as those already described is omitted.

In the first embodiment described above, the eccentricity amount of the radial center position of the ingot of the silicon single crystal 10 is measured using the eccentricity measuring device 20, and the ingot is cut into the ingot blocks using a general-purpose band saw, separately.

Figure 7:
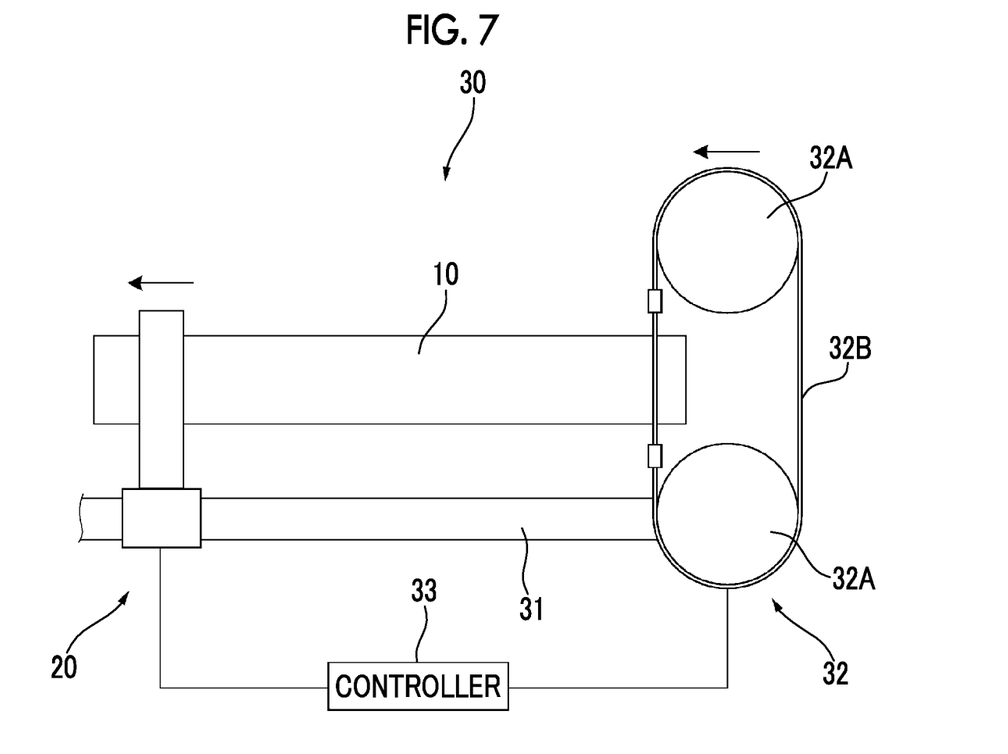
FIG. 7 is a schematic diagram showing a structure of a device for manufacturing an ingot block according to a second embodiment of the invention.

On the other hand, the present embodiment is different from the first embodiment in that an ingot block is manufactured by an ingot block manufacturing device 30 in which an eccentricity measuring device 20 and a cutting device 32 are integrated as shown in FIG. 7.

As shown in FIG. 7, the ingot block manufacturing device 30 includes a placing table (not shown) provided in a lower portion of the ingot of the silicon single crystal 10, an eccentricity measuring device 20, a rail 31, a cutting device 32, and a controller 33.

Since the eccentricity measuring device 20 as a measuring device has the same structure as that of the first embodiment, the description is omitted. The rail 31 is provided to extend along the longitudinal direction of the ingot block of the silicon single crystal 10 as in the first embodiment, and supports the eccentricity measuring device 20 to be movable in the extending direction.

The cutting device 32 is supported to be movable on the rail 31 similarly to the eccentricity measuring device 20. The cutting device 32 is a general-purpose band saw cutting device, and includes a pair of pulleys 32A and a blade 32B.

The pair of pulleys 32A are rotatably supported on a support table (not shown), and one of the pulleys is connected to a drive source such as a servo motor.

The blade 32B is wound around the pair of pulleys 32A. The blade 32B is formed of an endless belt having a predetermined width dimension, and a cutting edge made of a metal bond or the like is formed at a lower end portion of the blade 32B in the width direction.

Figure 8:
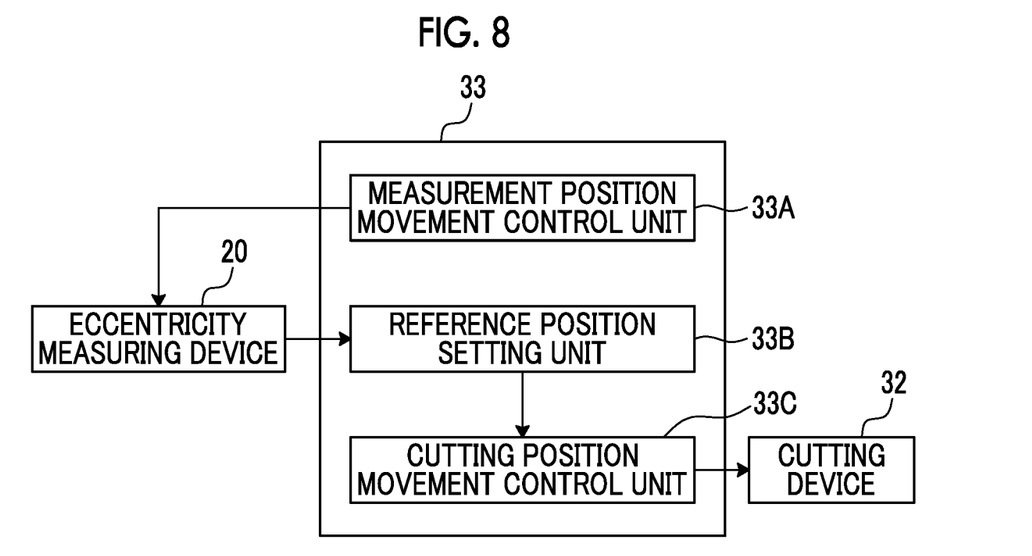
FIG. 8 is a functional block diagram showing a structure of a controller according to the second embodiment.

The controller 33 as a control device performs movement control and measurement control of the eccentricity measuring device 20 and movement control and cutting control of the cutting device 32. As shown in FIG. 8, the controller 33 includes a measurement position movement control unit 33A, a reference position setting unit 33B, and a cutting position movement control unit 33C.

The measurement position movement control unit 33A controls a position on the rail 31 at which the eccentricity measuring device 20 is moved. The measurement position movement control unit 33A performs positioning control on the eccentricity measuring device 20 from the end portion of the straight body portion of the ingot of the silicon single crystal 10 in a stepwise manner, and moves the eccentricity measuring device 20 to the uniform position of the ingot in the longitudinal direction.

The reference position setting unit 33B sets, as a reference position, a position where the radial center position of the ingot measured by the eccentricity measuring device 20 is equal to or larger than a threshold value set for a predetermined eccentricity amount Δ. Specifically, for example, the reference position setting unit 33B reads Equation (2) above from a memory or the like, and substitutes the offset amount measured by the eccentricity measuring device 20 into Equation (2), and sets the reference position in a range exceeding a threshold value set as less than the eccentricity amount Δ in a portion where the offset amount of the radial center position of the silicon single crystal 10 is equal to or less than a predetermined eccentricity amount Δ. The set reference position is stored in a storage device such as the memory of the controller 33.

The cutting position movement control unit 33C calls out the cutting position set by the reference position setting unit 33B from the memory, moves the cutting device 32 to the cutting position, starts driving the servo motor of the cutting device 32, outputs a control instruction to the cutting device 32, and cuts the ingot of the silicon single crystal 10 into the ingot blocks of a predetermined length dimension.

According to this embodiment, the same operations and effect as those of the first embodiment can be obtained.

The invention claimed is:

1. A method for manufacturing an ingot block in which an ingot of a silicon single crystal pulled up by a Czochralski process is cut and subjected to outer periphery grinding to manufacture an ingot block of the silicon single crystal, the method comprising:
    measuring a radial center position of the ingot at one or more locations along a longitudinal direction of the ingot;
    setting a reference position at which an offset amount of the measured radial center position of the ingot is equal to or less than a predetermined eccentricity amount;
    cutting the ingot into the ingot blocks based on the set reference position; and
    performing outer periphery grinding on each of the cut ingot blocks,
    wherein in the measuring of the radial center position of the ingot, an end portion of an outer peripheral surface of the ingot is irradiated with laser light, the irradiated laser light is detected to detect an end portion position of the outer peripheral surface of the ingot, and the radial center position of the ingot is calculated based on the detected end portion position of the outer peripheral surface of the ingot.

2. The method for manufacturing an ingot block according to claim 1, wherein in the measuring of the radial center position of the ingot, the radial center position is measured while the ingot is rotated in a circumferential direction.

3. The method for manufacturing an ingot block according to claim 1, wherein in a case where a diameter of the ingot is 312 mm and a diameter of a semiconductor wafer manufactured from the ingot is 300 mm, the predetermined eccentricity amount Δ (mm) is obtained by Equation (1):

$$3 \text{ mm} \geq \Delta \qquad (1).$$

4. A method for manufacturing a semiconductor wafer, the method comprising:
    manufacturing an ingot block of a silicon single crystal by using the method for manufacturing an ingot block according to claim 1; and
    slicing the manufactured ingot block to manufacture a plurality of wafers.

5. A device for manufacturing an ingot block which cuts an ingot of a silicon single crystal pulled up by a Czochralski process to manufacture an ingot block of the silicon single crystal, the device comprising:
    a placing table on which the ingot is placed;
    a measuring device that is provided to be movable along a longitudinal direction of the ingot on the placing table;
    a cutting device that is provided to be movable along the longitudinal direction of the ingot on the placing table; and
    a control device that performs movement control of the measuring device and the cutting device,
    wherein the measuring device includes
    an outer peripheral end surface position detection unit that irradiates an end portion of an outer peripheral surface of the ingot with laser light and detects the irradiated laser light to detect an end portion position of the outer peripheral surface of the ingot, and
    a center position calculating unit that calculates a radial center position of the ingot based on the end portion position of the outer peripheral surface of the ingot detected by the outer peripheral end surface position detection unit, and
    the control device includes
    a measurement position movement control unit that moves the measuring device and measures the radial center position of the ingot at one or more locations in the longitudinal direction of the ingot,
    a reference position setting unit that sets a reference position at which an offset amount of the radial center position calculated by the center position calculating unit is equal to or less than a predetermined eccentricity amount at each location in the longitudinal direction of the ingot, and
    a cutting position movement control unit that moves the cutting device to the reference position set by the reference position setting unit and performs cutting of the ingot.

* * * * *